US007811741B2

(12) United States Patent
Kazmaier et al.

(10) Patent No.: US 7,811,741 B2
(45) Date of Patent: Oct. 12, 2010

(54) REVERSE WRITE ERASABLE PAPER

(75) Inventors: Peter M. Kazmaier, Mississauga (CA); Eric Shrader, Belmont, CA (US); Kentaro Morimitsu, Mississauga (CA); Tyler Norsten, Felicium Court (SG); Gabriel Iftime, Mississauga (CA); Fazilia Seker, Mississauga (CA); Naveen Chopra, Oakville (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/391,499

(22) Filed: Feb. 24, 2009

(65) Prior Publication Data

US 2010/0216635 A1 Aug. 26, 2010

(51) Int. Cl.
*G03F 7/00* (2006.01)
*G03F 7/004* (2006.01)
*G03F 7/20* (2006.01)

(52) U.S. Cl. .............................. 430/270.1; 430/270.15; 430/19; 430/396; 430/394

(58) Field of Classification Search ............. 430/270.1, 430/270.15, 19
See application file for complete search history.

(56) References Cited

U.S. PATENT DOCUMENTS

| | | | | |
|---|---|---|---|---|
| 6,576,747 | B1 * | 6/2003 | Carlini et al. | 534/649 |
| 6,590,082 | B1 * | 7/2003 | Banning et al. | 534/649 |
| 7,205,088 | B2 * | 4/2007 | Iftime et al. | 430/270.1 |
| 7,214,456 | B2 * | 5/2007 | Iftime et al. | 430/19 |
| 7,256,921 | B2 * | 8/2007 | Kumar et al. | 359/241 |
| 2005/0244744 | A1 | 11/2005 | Kazmaier et al. | |
| 2006/0222972 | A1 | 10/2006 | Chopra et al. | |
| 2008/0044747 | A1 | 2/2008 | Iftime et al. | |

FOREIGN PATENT DOCUMENTS

JP 2003255490 A * 9/2003

OTHER PUBLICATIONS

Machine translation of JP 2003-255490.*
European Patent Office, European Search Report, European Application No. 10154295.9; May 20, 2010, 3 pages.

* cited by examiner

*Primary Examiner*—Amanda C. Walke
(74) *Attorney, Agent, or Firm*—MH2 Technology Law Group LLP

(57) ABSTRACT

An image-forming medium and methods for forming and imaging the medium are provided. The disclosed medium can be strongly colored under room illumination (or deliberate UV) and can be selectively discolored at an appropriate light wavelength to form an image. In one embodiment, the image-forming medium can include a substrate (e.g., a sheet of paper), a photochromic material incorporated with the substrate, and a photo-absorbing material incorporated with the photochromic material. Exemplary methods for using the image-forming medium to make a transient image can include first forming the image-forming medium by applying a coating solution containing photochromic material to the substrate or paper. The image-forming medium can have a medium color and can then be selectively exposed to a radiation through a mask to convert the photochromic material from a colored form to a colorless form and thus to form an image having a color contrast with its background.

23 Claims, 2 Drawing Sheets

REVERSE WRITE ERASABLE PAPER

DESCRIPTION OF THE INVENTION

1. Field of the Invention

This invention relates generally to documents and, more particularly, to image forming media or reverse write erasable papers, and compositions and methods for making and using such image forming media.

2. Background of the Invention

Paper documents are often promptly discarded after being read. Although paper is inexpensive, the quantity of discarded paper documents is enormous and the disposal of these discarded paper documents raises significant cost and environmental issues. In addition, it would be desirable that paper documents can be reusable, to minimize cost and environmental issues.

Photochromic paper, also known as erasable paper, provides imaging medium that can be reused many times to transiently store images and documents. For example, photochromic paper employs photochromic materials to provide an imaging medium for containing desired images. Typically, photochromic materials can undergo reversible or irreversible photoinduced color changes in the photochromic containing imaging layer. For example, photochromic materials of spiropyrans in acetone solution exhibit images having lifetimes of at least two days.

In addition, the reversible photoinduced color changes enable image-writing and image-erasure of photochromic paper in sequence on the same paper. For example, an ultraviolet (UV) light source can be used for inducing image-writing, while a combination of heat and a visible light source can be used for inducing image-erasure. However, the erasing process occurs even while a document is lying on the desk, due to the presence of ambient temperature and ambient light in, for example, an office environment. Further, erasable paper is often to be paper-like and often uses a color to distinguish from regular paper. Although the paper coloration is useful for identifying erasable paper, the paper coloration reduces the contrast between the image and the background. High image contrast for colored papers is therefore desired.

Thus, there is a need to overcome these and other problems of the prior art and to provide an image-forming medium and methods for making and using the image-forming medium. It is also desirable that the image-forming medium can possess a longer image life and/or a controlled image area.

SUMMARY OF THE INVENTION

According to various embodiments, the present teachings include an image-forming medium that can include a substrate; a photochromic material disposed on or within the substrate, and a photo-absorbing material disposed on or within the photochromic material. The photochromic material can be capable of a reversible transition between a colored form and a colorless form. The image-forming medium can possess a first color, while the photo-absorbing material can have a second color exhibiting a color contrast from the first color.

According to various embodiments, the present teachings also include a method for forming a transient image. In this method, an image-forming medium can be formed to have a first color and to include a substrate, a photochromic material and a photo-absorbing material that absorbs a second color. A mask can then be provided to have a mask feature corresponding to an image to be formed. The image-forming medium can be selectively exposed to a radiation through the provided mask to convert one or more portions of the photochromic material from a colored form to a colorless form, and thus forming the image on the substrate. The formed image can be in one color of the first color and the second color, while the substrate can be in the other color of the first color and the second color.

According to various embodiments, the present teachings further include a method for forming a transient image. The transient image can be formed by first forming an image-forming medium that is in a first color and that includes a substrate, a photochromic material and a photo-absorbing material that absorbs a second color. The image-forming medium can then be selectively exposed to a radiation on a pixel-by-pixel basis to convert one or more portions of the photochromic material from a colored form to a colorless form to form the image on the substrate. The formed image can be in one color of the first color and the second color, while the substrate can be in the other color of the first color and the second color.

According to various embodiments, the present teachings further include a method for forming a transient image. The transient image can be formed by first forming an image-forming medium in a green color. The green image-forming medium can include a paper, a photochromic material containing a dithienylethene, and a photo-absorbing material containing a yellow colorant. A mask can then be provided to have a mask feature corresponding to an image to be formed. The image-forming medium can then be selectively exposed to a light emitting diode (LED) radiation through the provided mask to convert one or more portions of the photochromic material from a colored form to a colorless form, and thus forming the image on the image-forming medium. In one embodiment, the image can be yellow on a background colored green, or the image can be green on a background colored yellow.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
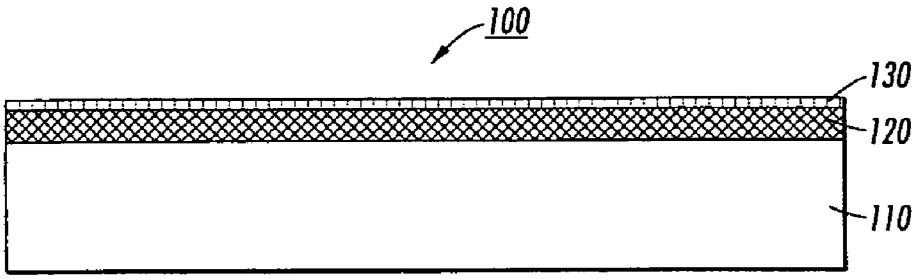
FIG. 1 depicts an exemplary image-forming medium in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Exemplary embodiments provide an image-forming medium and methods for forming and imaging such medium. The image-forming medium can be strongly colored under room illumination (or deliberate UV) and can be selectively discolored at an appropriate light wavelength. In one embodiment, the image-forming medium can include a substrate (e.g., a sheet of paper), a photochromic material incorporated with the substrate, and a photo-absorbing material incorporated with the photochromic material to provide a first color (also referred to herein as medium color) on the substrate. The photochromic material can be capable of a reversible transition between a colored form and a colorless form; and the photo-absorbing material can provide a second color exhibiting a color contrast from the first color.

Exemplary methods for using the image-forming medium to make a transient image can include first forming the image-forming medium that has the first color. The image-forming medium can be prepared by applying a coating solution including photochromic material(s), optional binder(s) and/or photo-absorbing material(s) to a substrate or paper. The image-forming medium can then be selectively exposed to a radiation having a light wavelength through a mask containing mask feature(s) corresponding to image(s) to be formed. During this exposure, selective portion(s) of the photochromic material can be converted, e.g., from a colored form to a colorless form. The image can then be formed having a color contrast with its background. For example, the image can have one color of the first and second colors and can be formed on a background having the other color of the first and second colors.

In various embodiments, the color contrast can include a contrast between, for example, two, three or more different colors on the apparent luminous difference or color intensity. The term "color" can encompass a number of aspects such as hue, lightness and saturation, where one color may be different from another color if the two colors differ in at least one aspect. For example, two colors having the same hue and saturation but are different in lightness can be considered different colors. In various embodiments, the color contrast can include any degree of color contrast sufficient to render an image discernable to a user, regardless of whether the color contrast changes or is constant during the visible time.

Any suitable color, such as, for example, yellow, green, red, white, black, gray, cyan, magenta, blue, and purple, can be used to produce a color contrast, for example, between the first color and the second color as described herein. In various embodiments, the following exemplary color contrasts can be used for the image formation including yellow or light yellow image on a green or dark green background, green or dark green image on a yellow or light yellow background, yellow image on a white background; dark gray or black image on a light or white background, and purple image on a white background.

FIG. 1 depicts an exemplary image-forming medium 100 in accordance with the present teachings. It should be readily apparent to one of ordinary skill in the art that the image-forming medium 100 depicted in FIG. 1 represents a generalized schematic illustration and that other layers/components can be added or existing layers/components can be removed or modified.

As shown in FIG. 1, the image-forming medium 100 can include a substrate 110, a photochromic material 120 incorporated into or onto the substrate 110 and a photo-absorbing material 130 incorporated with the photochromic material 120. The photochromic material 120 and the photo-absorbing material 130 can provide reverse writing erasable image-forming medium on the substrate 110.

The substrate 110 can include, for example, any suitable material such as paper, wood, plastics, fabrics, textile products, polymeric films, inorganic substrates such as metals, and the like. The paper can include, for example, plain papers such as XEROX® 4024 papers, ruled notebook paper, bond paper, silica coated papers such as Sharp Company silica coated paper, Jujo paper, and the like. The plastic can include, for example, a plastic film, such as polyethylene film, polyethylene terepthalate, polyethylene naphthalate, polystyrene, polycarbonate, polyethersulfone. The substrate 110, such as a sheet of paper, can have a blank appearance.

In various embodiments, the substrate 110 can be made of a flexible material and can be transparent or opaque. The substrate 110 can be a single layer or multi-layer where each layer is the same or different material and can have a thickness, for example, ranging from about 0.3 mm to about 5 mm.

The photochromic material 120 can be impregnated, embedded or coated to the substrate 110, for example, a porous substrate such as paper. In various embodiments, the photochromic materials 120 can be applied uniformly to the substrate 110 and/or fused or otherwise permanently affixed thereto.

The photochromic material 120 can include, for example, dithienylethenes (DTEs), spiropyrans, spiroxazines, chromes, spirodihydroindolizines, and fulgides. The photochromic material 120 can undergo reversible transformation of chemical species between two forms by the absorption of electromagnetic radiation, where the two forms have different absorption spectra. For example, when the exemplary dithienylethenes are in a ring-open form, the photochromic material can be in a colorless form. However, the dithienylethenes can also undergo a chemical ring closure, which yields pink, deep blue, deep green or yellow color when exposed to light at a wavelength from about 190 to about 425 nanometers, depending on the substituent chemical groups on the dithienylethene (DTE) compounds. Under ambient illumination or sunlight, DTEs can absorb further into the blue, as compared with typical photochromic materials such as spiropyrans, and therefore automatically color on exposure to fluorescent light, UV light or room illumination, and thereby causing the irradiated areas to appear colored. For example, the DTEs can include compounds that naturally background colorization in other hues. In an exemplary embodiment, the DTEs can give a deep green background color that can stably appear over a matter of days. In addition, such green colored background papers are desired because the green color signifies that these media can be environmentally friendly and the green background can also be used to improve readability to images formed thereon.

In various embodiments, the photochromic material 120 can optionally include binder materials. The binder materials can be a suspending medium to hold the photochromic material as a film or layer on the substrate of interest. The binder can provide any or all of the following properties, such as, for example, mechanical flexibility, robustness, and optical clarity. Any suitable binder can be used, for example, a polymer material. Examples of polymer materials that can be used as binders can include: polycarbonates, polystyrenes, polysulfones, polyethersulfones, polyarylsulfones, polyarylethers, polyolefins, polyacrylates, polymethacrylates, polyvinyl derivatives, cellulose derivatives, polyurethanes, polyamides, polyimides, polyesters, silicone resins, and epoxy resins and the like. Copolymer materials such as polystyrene-acrylonitrile, polyethylene-acrylate, vinylidenechloride-vinylchloride, vinylacetate-vinylidene chloride, styrene-alkyd resins can also be examples of suitable binder materials. The copolymers can be block, random, or alternating copolymers.

In various embodiments, a solvent may be used to dissolve the photochromic material, and the optional binder to enable processing to create, for example, a uniform film coating on the substrate. In various embodiments, the solvent can be volatile enough so that it can be conveniently removed during subsequent drying. Water can be used as a solvent for water soluble binders such as poly(vinyl alcohol) and water soluble photochromic and/or light absorbing materials. Other suitable solvents can include, for example, halogenated and nonhalogenated solvents, such as tetrahydrofuran, trichloro- and tetrachloroethane, dichloromethane, chloroform, monochlorobenzene, toluene, xylenes, acetone, methanol, ethanol, xylenes, benzene, ethyl acetate and the like. In various embodiments, the solvent can include, e.g., one, two, three or more different solvents. Coating solutions can be prepared by, for example, dissolving photochromic material into a solution containing the optional polymeric binder dissolved in a suitable solvent. Various coating techniques as known to one of ordinary skill in the art can be used to apply the coating solution onto the substrate 110.

The light or photo-absorbing material 130 can include various colorants. For example, the light absorbing material 130 can include a yellow colorant containing, e.g., dimeric or polymeric yellow colorants coated on or embedded in the photochromic material 120. The yellow colorants, for example, yellow dyes, Azo pyridone yellow dyes, as disclosed in the related U.S. patent application Ser. No. 11/220,803, entitled "Reimageable Medium with Light Absorbing Material" can be suitable for use, which is hereby incorporated by reference in its entirety. In various embodiments, the azo pyridone yellow dyes can include, e.g., mono-pyridone and mono-anthranilate; dipyridone and bis anthranilate; or dianthranilate and bis-pyridone. In an exemplary embodiment, the photo-absorbing material 130 can be the yellow dye of menthyl anthranilate dodecyl pyridine.

In various embodiments, during formation of the image-forming medium or a reverse writing erasable paper, the yellow light absorbing material can be dissolved at the same time with the photochromic material in a solvent as disclosed herein to form the coating solution. In some cases, preparation of the coating solution can require heating in order to ensure a complete dissolution. For example, when dimeric or polymeric yellow colorants are used, heating can be necessary in order to ensure complete dissolution of the yellow colorant. In other embodiments, the exemplary yellow light absorbing material can be coated as a yellow over coat on a photochromic material incorporated substrate, e.g., on a photochromic-containing layer formed on a substrate.

Figure 2:
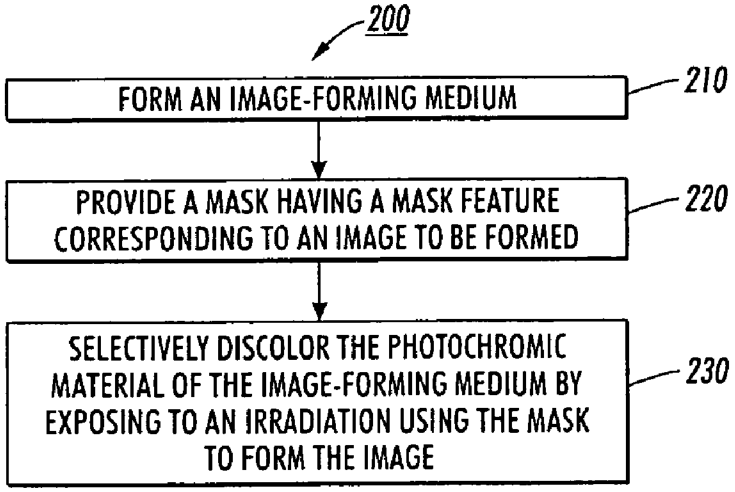
FIG. 2 depicts an exemplary method for forming an image in accordance with the present teachings.

Various embodiments also include a method for forming a colored image on a background having a color contrast with the colored image by using the disclosed image-forming medium. For example, FIG. 2 depicts an exemplary method 200 for forming an image in accordance with the present teachings. While the exemplary method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the present teachings. In addition, not all illustrated steps may be required to implement a methodology in accordance with the present teachings.

At 210 of FIG. 2, an image-forming medium can be formed to include, e.g., a substrate, a photochromic material and a photo-absorbing material (e.g., the yellow coat) for providing a first color or a medium color, e.g., as a visible background color in some embodiments, when the image-forming medium is exposed to a radiation, such as a UV light or sunlight. In addition, the photo-absorbing material can provide a second color exhibiting a color contrast from the first color. In various embodiments, desired images can be subsequently formed, e.g., in one color of the first and second colors, on a background in the other color of the first and second colors.

At 220 of FIG. 2, a mask can be provided having mask feature(s) corresponding to image(s) to be formed. As used herein, the term mask refers to a structure that includes one or more mask features used to endow an incoming beam of radiation, such as light, with or without a patterned cross-section, corresponding to a target region and/or image feature that is to be created in a target portion of the image-forming medium. In various embodiments, the mask features can include desired images, such as, for example, logo images and/or text images.

At 230 of FIG. 2, portion(s) of photochromic material of the image-forming medium can be selectively discolored, or erased, or converted from a colored form to a colorless form, by exposing to a radiation light through the mask to form or "writing" the image(s) on the image-forming medium. For example, the "erasing" irradiation can be used to selectively "erase" color (or discolor) of the chromatic material on the selectively exposed region of the medium but leaving the photo-absorbing material stay colored, for example, in the second color (e.g., yellow) on the exposed region. The non-exposed region of the medium substrate can still possess the first color or medium color. In various embodiments, the exposed region can form a visible image or be used as a background, or the non-exposed region can form the visible image or be used as the background, depending on the mask design.

In various embodiments, the radiation, e.g., light, can be used to selectively discolor photochromic material and can have an appropriate wavelength for converting the selected portion(s) of the photochromic material from the colored form to the colorless form. For example, such radiation can include a high power radiation using, e.g., visible light emitting diodes (LEDs), at a visible wavelength from about 400 nanometers to about 700 nanometers. The wavelength can be chosen in such a way that there is substantial overlap between the absorption envelope of the colored photochromic compound and the wavelength of the light emitting diode. In an additional example, the exposed region can be irradiated at a wavelength of about 620 nm using the LED light source. Other wavelengths, e.g., at about 400 nm or less, can also be used to provide the radiation. In various embodiments, the selective exposure can be processed for a time period ranging from about 0.5 seconds to 2 minutes.

In various embodiments, the formed image can include any desired images, such as, for example, logo images, text images, etc. The image information on the disclosed image-forming medium can be controlled to have an imaging area, for example, as small as about 5% to about 10% by area of the image-forming medium by controlling the exposed region.

In an exemplary embodiment, the image-forming medium can include a paper or other media substrate such as plastic; a DTE photochromic material on the medium and a yellow coat on the DTE photochromic material. In this case, yellow or light yellow image can be formed on a green or deep green media, or alternatively, green or deep green image can be formed on a yellow or light yellow image, depending on the determination of the exposed region and non-exposed region through the mask during the irradiation for discoloring the DTE photochromic material.

Figure 3A:
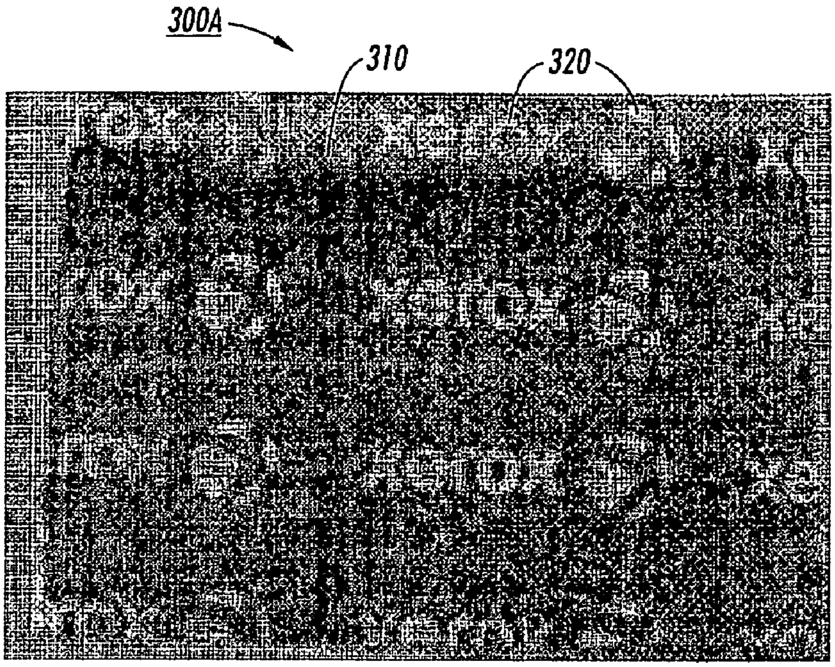
FIGS. 3A-3B depict exemplary images formed in accordance with the present teachings.
Figure 3B:
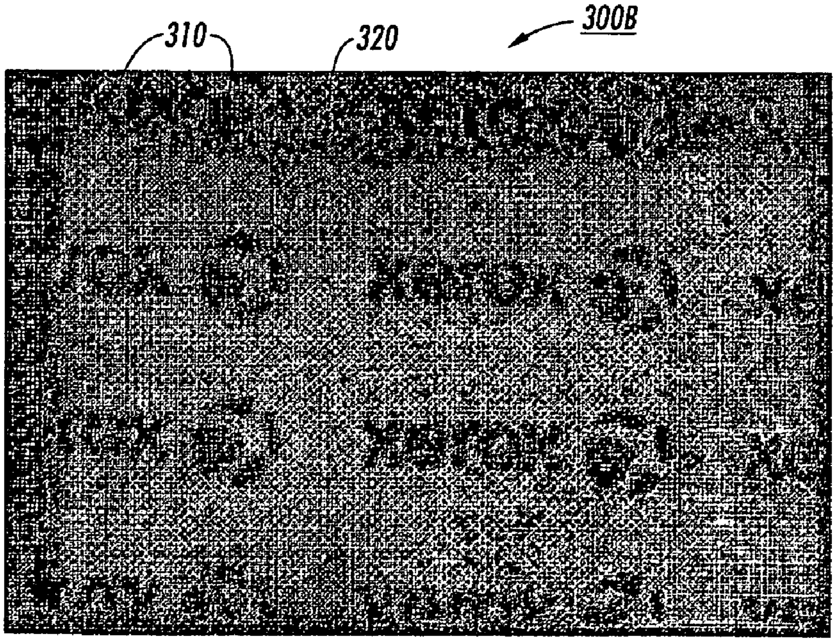

FIGS. 3A-3B depict exemplary images formed in accordance with the present teachings. As shown in the illustrated example, the image 300A and/or 300B can include a first color 310 in dark and a second color 320 in light. The first color and the second color can provide a color contrast to render visibility to an observer.

Specifically, the image 300A in FIG. 3A includes images such as "Xerox" and its Logos in the second color 320 such as in light yellow, formed on a paper substrate having a background in the first color 310 such as in deep green. In an exemplary embodiment, the deep green background can be provided by the image-forming medium that contains yellow dye and DTE on the paper substrate, while the light yellow image can be provided by the yellow photo-absorbing material having DTE discolored upon irradiation. In an exemplary embodiment, the green color of 310 can be achieved with flood exposure with a UV lamp, for example, at a wavelength ranging from about 250 nm to about 400 nm, or by exposing the medium to sunlight. The light yellow color of 320 can be produced by a selective erasure through a mask with a white light.

Likewise, the image 300B in FIG. 3B includes images, such as "Xerox" and its Logos, in the first color 310 such as in dark green, formed on a paper substrate having a background in the second color 320, such as in light yellow. In an exemplary embodiment, the dark or deep green image can be provided by the image-forming medium that contains yellow dye and DTE on a substrate, while the light yellow background can be provided by the yellow photo-absorbing material having DTE discolored upon irradiation.

In this manner, the disclosed image-forming medium and the methods for forming the image thereon can provide many advantages. In one example, the photochromic material and/or the photo-absorbing material do not revert to the colorless form at room temperature or under ambient visible light, which prevents auto-erasing process while the document lying on the desk. As a result, the colored form of the photochromic material and the visible image, remains stable and visible for longer time, e.g., 2 days to over one month In addition, visible LEDs are often inexpensive and can be available at higher power than their UV counterparts. Further, the image writing area can be controlled by the exposed region on the medium through a corresponding mask. Furthermore, the exemplary images can be, e.g., naturally green that provides a marketing advantage.

In various embodiments, the light emitting diodes (LEDs) can also be used to irradiate the medium substrate without use of a mask by turning the LEDs off and on to erase (discolor) the colored photochrome on a pixel by pixel basis to form an image.

In various embodiments, the formed visible image (e.g., text or logo image) can be "removed" or "erased" by converting the photochromic material from the colorless form back to the colored form to recover the image-forming medium with no images visible. The recovered image-forming medium can then be reusable for writing other image information by selectively erasing the color of or discolor the photochromic material using a corresponding mask having another mask feature related to the other image to be formed. For example, the photochromic material can be converted from the colorless form back to the colored form upon initiating a photochemical process where the visible actinic radiation is absorbed by the photochrome and this radiation can cause either the breaking of a bond as, for example, in DTEs, or the formation of a bond as in spiropyrans. In both cases, an isomer form which has little absorption in the visible region can appear colorless or very light yellow to the eye.

Referring back to FIG. 1, the substrate 110 of the image-forming medium can have any number of sides, such as two, three, four or more sides (e.g., a cube) and the substrate 110 can have a light color, particularly a white color, on any number of sides such as on one side or on two sides or on all sides. Images can be formed on where there is the image-forming medium. In an exemplary embodiment where the substrate is a sheet of paper, if the photochromic material 120 and the photo-absorbing material 130 are present on one side of the paper, the image can be formed on this one side of the paper, even though the paper substrate is two-sided.

The image-forming medium 100 and images formed thereon can be rigid or flexible and can have any suitable rigidity or flexibility depending on the intended use for the image-writing and image-erasure. The image-forming medium 100 and images formed thereon can have any suitable size such as the dimensions of a business card, the dimensions of a sheet of paper (e.g., A4 and letter sized), or larger, and the like. The image-forming medium 100 and images formed thereon can have any suitable shape such as planar (e.g., a sheet) or non-planar (e.g., cube, scroll, and a curved shape).

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An image-forming medium comprising:

a substrate;

a photochromic material disposed on or within the substrate, the photochromic material being capable of a reversible transition between a colored form and a colorless form in a selectively exposed area of the image-forming medium corresponding to one or more portions of the photochromic material, the selectively exposed area ranging from about 5% to about 10% by area of the image-forming medium; and a photo-absorbing material disposed on or within the photochromic material to provide a first color on the substrate, wherein the photo-absorbing material comprises a second color exhibiting a color contrast from the first color.

2. The medium of claim 1, wherein the photochromic material comprises dithienylethene (DTE), spiropyrans, spiroxazines, chromes, spirodihydroindolizines, and fulgides.

3. The medium of claim 1, wherein the photo-absorbing material comprises one or more materials comprising monopyridone and mono-anthranilate; dipyridone and bis anthranilate; dianthranilate and bis-pyridone, or menthyl anthranilate dodecyl pyridine.

4. The medium of claim 1, wherein the first color is a green color and the second color is a yellow color, when the photo-absorbing material is a yellow dye and the photochromic material is a dithienylethene.

5. The medium of claim 1, wherein the photochromic material undergoes the transition from the colored form to the colorless form by irradiation with a visible light emitting diode (LED) having a wavelength ranging from about 400 nm to about 700 nm.

6. The medium of claim 1, further comprising an image formed by selectively converting the photochromic material from the colored form to the colorless form.

7. The medium of claim 6, wherein the image is in one color of the first color and the second color and the substrate is in the other color of the first color and the second color.

8. The medium of claim 7, wherein the image on the substrate comprises a green image on a yellow background, or a yellow image on a green background.

9. The medium of claim 1, further comprising an optional polymer binder for supporting the photochromic material on the substrate.

10. The medium of claim 9, wherein the polymer binder is selected from the group consisting of polyethylene, polypropylene, polystyrene, polyisoprene, and polyisobutylene.

11. The medium of claim 9, wherein the polymer binder is selected from the group consisting of polymethyl methacrylate, polycarbonates, polystyrenes, poly(styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, polystyrene-acrylonitrile, polyethylene-acrylate, vinylidenechloride-vinylchloride, vinylacetate-vinylidene chloride, styrene-alkyd resins, and mixtures and copolymers thereof.

12. The medium of claim 1, wherein the substrate is selected from the group consisting of paper, glass, ceramic, wood, plastic, fabric, textile, metals, plain paper, and coated paper.

13. A method of forming a transient image comprising:

forming an image-forming medium, wherein the image-forming medium is in a first color and comprises a substrate, a photochromic material and a photo-absorbing material that absorbs a second color;

providing a mask having a mask feature corresponding to an image to be formed;

selectively exposing the image-forming medium to a radiation through the provided mask to convert one or more portions of the photochromic material from a colored form to a colorless form to form the image on the substrate, wherein the image is in one color of the first color and the second color and the substrate is in the other color of the first color and the second color; and controlling the selective exposure to an area of the image-forming medium that corresponds to the one or more portions of the photochromic material, wherein the image area is controlled ranging from about 5% to about 10% by area of the image-forming medium.

14. The medium of claim 13, wherein the image on the substrate comprises a green image on a yellow background, or a yellow image on a green background.

15. The method of claim 13, further comprising erasing the image from the image-forming medium by converting the photochromic material from the colorless form to the colored form.

16. The method of claim 15, further comprising reusing the erased image-forming medium by repeating steps comprising:

providing another mask having another mask feature corresponding to another image to be formed; and selectively exposing the image-forming medium to the radiation through the provided mask to convert one or more portions of the photochromic material from a colored form to a colorless form to form another image on the substrate, wherein the image is in one color of the first color and the second color and the substrate is in the other color of the first color and the second color.

17. The method of claim 13, wherein forming the image-forming medium further comprises:

preparing a coating solution comprising the photochromic material, and an optional polymer binder;

applying the coating solution onto the substrate to form a photochromic-containing layer;

forming a photo-absorbing over coat onto the photochromic containing layer.

18. The method of claim 13, wherein forming the image-forming medium further comprises:

preparing a coating solution comprising the photochromic material, an optional polymer binder and a photo-absorbing material; and applying the coating solution onto the substrate to form the image-forming medium.

19. A method of forming a transient image comprising:

forming an image-forming medium, wherein the image-forming medium is in a first color and comprises a substrate, a photochromic material and a photo-absorbing material that absorbs a second color;

selectively exposing the image-forming medium to a radiation on a pixel-by-pixel basis to convert one or more portions of the photochromic material from a colored form to a colorless form to form the image on the substrate, wherein the image is in one color of the first color and the second color and the substrate is in the other color of the first color and the second color; and controlling the selective exposure to an area of the image-forming medium that corresponds to the one or more portions of the photochromic material, wherein the image area is controlled ranging from about 5% to about 10% by area of the image-forming medium.

20. The method of claim 19, further comprising using a light emitting diode (LED) light source to provide the radiation for the selective exposure at a wavelength ranging from about 400 nm to about 700 nm, wherein the LED light source is fixed or moveable.

21. A method of forming a transient image comprising:

forming an image-forming medium in a green color, wherein the image-forming medium comprises a paper, a photochromic material containing a dithienylethene, and a photo-absorbing material containing a yellow colorant;

providing a mask having a mask feature corresponding to an image to be formed;

selectively exposing the image-forming medium to a LED radiation through the provided mask to convert one or more portions of the photochromic material from a colored form to a colorless form to form the image on the image-forming medium, wherein the image is yellow on a background colored green, or the image is green on a background colored yellow; and controlling the selective exposure to an area of the image-forming medium that corresponds to the one or more portions of the photochromic material, wherein the image area is controlled ranging from about 5% to about 10% by area of the image-forming medium.

22. The method of claim 21, further comprising selectively flood exposing the image-forming medium to the LED radiation at a wavelength of about 250 nm to about 400 nm.

23. An image-forming medium comprising:

a substrate;

a photochromic material disposed on or within the substrate, the photochromic material comprising dithienylethene and being capable of a reversible transition between a colored form and a colorless form; and a photo-absorbing material disposed on or within the photochromic material to render the image-forming medium a first color in green, wherein the photo-absorbing material comprises a second color exhibiting a color contrast from the first color in green and wherein a transition from the colored form to the colorless form of one or more portions of the photochromic material leaves the second color in the one or more portions of the transitioned photochromic material surrounded by the first color in green.

* * * * *